United States Patent
Lee et al.

(10) Patent No.: US 11,387,842 B1
(45) Date of Patent: Jul. 12, 2022

(54) SYSTEM AMD METHOD FOR A SELF-CALIBRATING PIPELINED DYNAMIC PREAMPLIFIER FOR HIGH SPEED COMPARATORS IN A TIME-INTERPOLATING FLASH ADC

(71) Applicant: Robert Bosch GmbH, Stuttgart (DE)

(72) Inventors: Sangwoo Lee, Seoul (KR); Sayyed Mahdi Kashmiri, San Jose, CA (US); Kenneth Wojciechowski, Cupertino, CA (US)

(73) Assignee: Robert Bosch GmbH

( * ) Notice: Subject to any disclaimer, the term of this patent is extended or adjusted under 35 U.S.C. 154(b) by 0 days.

(21) Appl. No.: 17/197,787

(22) Filed: Mar. 10, 2021

(51) Int. Cl.
*H03M 1/12* (2006.01)
*H03M 3/00* (2006.01)

(52) U.S. Cl.
CPC ........... *H03M 3/456* (2013.01); *H03M 3/422* (2013.01); *H03M 3/486* (2013.01); *H03M 3/494* (2013.01)

(58) Field of Classification Search
CPC ...... H03M 3/456; H03M 3/422; H03M 3/486; H03M 3/494; H03M 1/12
USPC ........................................................ 341/155
See application file for complete search history.

(56) References Cited

U.S. PATENT DOCUMENTS

| | | | |
|---|---|---|---|
| 5,867,116 A | 2/1999 | Nakamura et al. | |
| 8,063,811 B2 | 11/2011 | Hojabri et al. | |
| 8,368,576 B2* | 2/2013 | Bardsley | H03M 1/12 341/162 |
| 8,692,582 B1* | 4/2014 | Atesoglu | H03K 5/249 327/65 |
| 8,928,517 B2* | 1/2015 | Bardsley | H03M 1/1215 341/172 |
| 9,219,490 B1* | 12/2015 | Pereira | H03M 1/007 |
| 2011/0084860 A1* | 4/2011 | Murden | H03M 1/1215 341/110 |
| 2012/0133535 A1* | 5/2012 | Verbruggen | H03M 1/1023 341/110 |
| 2012/0274497 A1* | 11/2012 | Bardsley | H03M 1/00 341/150 |
| 2013/0120173 A1* | 5/2013 | Bardsley | H03M 1/00 341/110 |
| 2013/0229294 A1* | 9/2013 | Matsuno | H03M 1/12 341/155 |

* cited by examiner

*Primary Examiner* — Jean B Jeanglaude
(74) *Attorney, Agent, or Firm* — Dickinson Wright PLLC

(57) ABSTRACT

A system including a circuit, including a first preamplifier, a sampling switch, a regenerative latch, and a second preamplifier aligned in a pipelined sequence with the first preamplifier, wherein the first and second preamplifier are associated with dynamic comparator and configured to gain signal utilizing multiple cascaded gains and sample-and-hold stages including a plurality of phases.

20 Claims, 8 Drawing Sheets

SYSTEM AMD METHOD FOR A SELF-CALIBRATING PIPELINED DYNAMIC PREAMPLIFIER FOR HIGH SPEED COMPARATORS IN A TIME-INTERPOLATING FLASH ADC

TECHNICAL FIELD

The present disclosure relates to amplifiers, and various circuits that may utilizes one or more amplifiers.

BACKGROUND

Amplifiers may be used to magnify a signal. Amplifiers may be utilized in a number of applications, including LIDAR applications.

SUMMARY

According to one embodiment, a system includes a circuit that includes a first preamplifier, a sampling switch, a regenerative latch, and a second preamplifier aligned in a pipelined sequence with the first preamplifier, wherein the first and second preamplifier are associated with dynamic comparator and configured to gain signal utilizing multiple cascaded gains and sample-and-hold stages including a plurality of phases.

According to a second embodiment, a pipelined dynamic preamplifier system includes a first dynamic preamplifier, a second dynamic preamplifier, wherein the first and second dynamic preamplifier are arranged in a pipelined sequence, one or more sampling switches, and a regenerative latch, wherein the regenerative latch is configured to gain signal utilizing multiple cascaded gains and sample-and-hold stages including a plurality of phases.

According to a third embodiment, a method for outputting a digital signal via a pipelined dynamic preamplifier system includes arranging in a cascading arrangement a first dynamic preamplifier and a second dynamic preamplifier, and quantizing the digital signal during a final phase of a sample-and-hold sequence, wherein the quantizing utilizes a regenerative latch.

DETAILED DESCRIPTION

Figure 1:
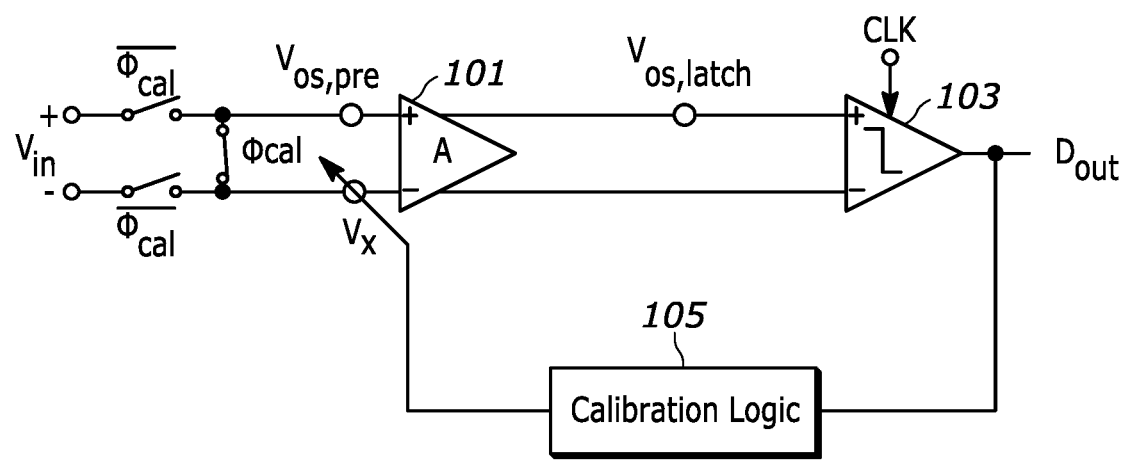
FIG. 1 discloses a schematic of a comparator that includes a preamplifier and a regenerative latch.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

An FMCW (Frequency-Modulated Continuous-Wave) type automotive Lidar (Light ranging and detection) system requires a high speed analog-to-digital converter (ADC) for its readout. This may be because its input signal, which varies depending on the distance to the target object, can have a bandwidth up to 1 GHz. In addition to this, it is also required to have a moderate resolution (6 bits) to detect the reflectivity of the target object. Finally, the ADC design may avoid generating so-called ghost targets which take the form of spurious tones at its output. Considering the required bandwidth and resolution, a flash ADC may be the most suitable candidate. However, an N-bit flash ADC requires at least 2N−1 number of comparators which results in a large chip size and power consumption of the ADC. One main performance parameter for the ADC is the input referred offset of each level detection comparator, which should be minimized to avoid non-linearity and non-monotonicity. For example, in a 6 bit flash ADC, the standard deviation of the offset should be less than 0.15 LSB to have 99.9% yield rate for monotonicity. Typically, a low offset comparator can be realized by increasing the size of transistors, but this may significantly limit its speed due to the increase of the size of parasitic capacitors. Often, a preamplifier with an interpolating scheme followed by a regenerative latch may be used to realize the comparator. The interpolating scheme can reduce the number of comparators by half. Usually, the offset of the regenerative latch is mitigated by the gain of the preamplifier when referred to the input while the offset of the preamplifier should be compensated by a calibration or an auto-zeroing scheme. However, realizing sufficient gain (×5~×20) in the preamplifier in order to suppress the offset of the regenerative latch becomes a major bottleneck when designing for high-speed applications. In prior art, high-speed, latch-based (positive feedback) preamplifiers have been investigated but this approach may not amenable to automotive applications where robustness over process, temperature and supply voltage variations (PVT variations) must be guaranteed.

This disclosure of the various embodiments below proposes a solution to the abovementioned problem by introducing a pipelined dynamic preamplifier for high speed comparators in a ×2 interpolating flash ADC. The proposed pipelining method maximizes the gain of the preamplifier, and therefore, effectively suppresses the offset of the comparator without sacrificing conversion speed of the ADC while providing a PVT (Performance Verification Testing) tolerant calibration method.

FIG. 1 discloses a schematic of a comparator that includes a preamplifier and a regenerative latch. A preamplifier 101 may be widely used for the amplification of the analog input signal before the regenerative latch, including a comparator 103, which produces the digital output bit. This may not only helps reduce the offset of the latch but also prevents an input driver and a reference driver from the kickback of the latch. In this embodiment, there may be two main offset sources, the input referred offset of the preamplifier 101, which is referred to as ($V_{os,pre}$), and the input referred offset of the regenerative latch ($V_{os,latch}$). Then, the input referred noise ($V_{OS,comp}$) to this can be depicted by:

$$V_{OS,comp} = \sqrt{V_{OS,pre}^2 + \frac{V_{OS,latch}^2}{A^2}} \quad (1)$$

where A is the gain of the preamplifier. In a typical implementation, $V_{OS,comp}$ is dominated by the offset of the preamplifier. Therefore, the preamplifier should be accompanied with an offset reduction technique adequate to the specific application while at the same time the gain of this preamplifier should be maximized to make the offset of the latch negligible. An auto-zeroing technique is widely used to compensate the preamplifier offset. A possible drawback of this technique is that it may require a dedicated phase to sample the offset of the preamplifier so that this can be stored in a memory (usually capacitors) in order to be used for compensation during the conversion, making its use challenging in high-speed applications. An alternative to that, there may be the use of calibration techniques. Calibration could be performed after production in the factory, however, this does not guarantee performance during lifetime and over environmental variations (PVT robustness). Therefore, self-calibration techniques may be used, as the offset can be calibrated periodically during the operation, such as when the ADC is not used without sacrificing speed to allocate specific phases such as those that auto-zeroing techniques require. As shown on the FIG. 1, when the self-calibration starts, $\phi_{cal}$ goes high which ties input terminals of the comparator 103, whereas disconnecting input source ($V_{in}$). Therefore, an output of comparator ($D_{out}$) is determined by the offset of the comparator 103, which may be $V_{OS,comp}$. Thus, depending on the polarity of the output ($D_{out}$), a calibration logic 105 may be configured to start to tune calibrating voltage ($V_X$) in a negative feedback wise. In a result, $V_X$ reaches near to $V_{OS,comp}$ at the end of calibration then effectively cancels the offset of comparator 103.

Figure 2:
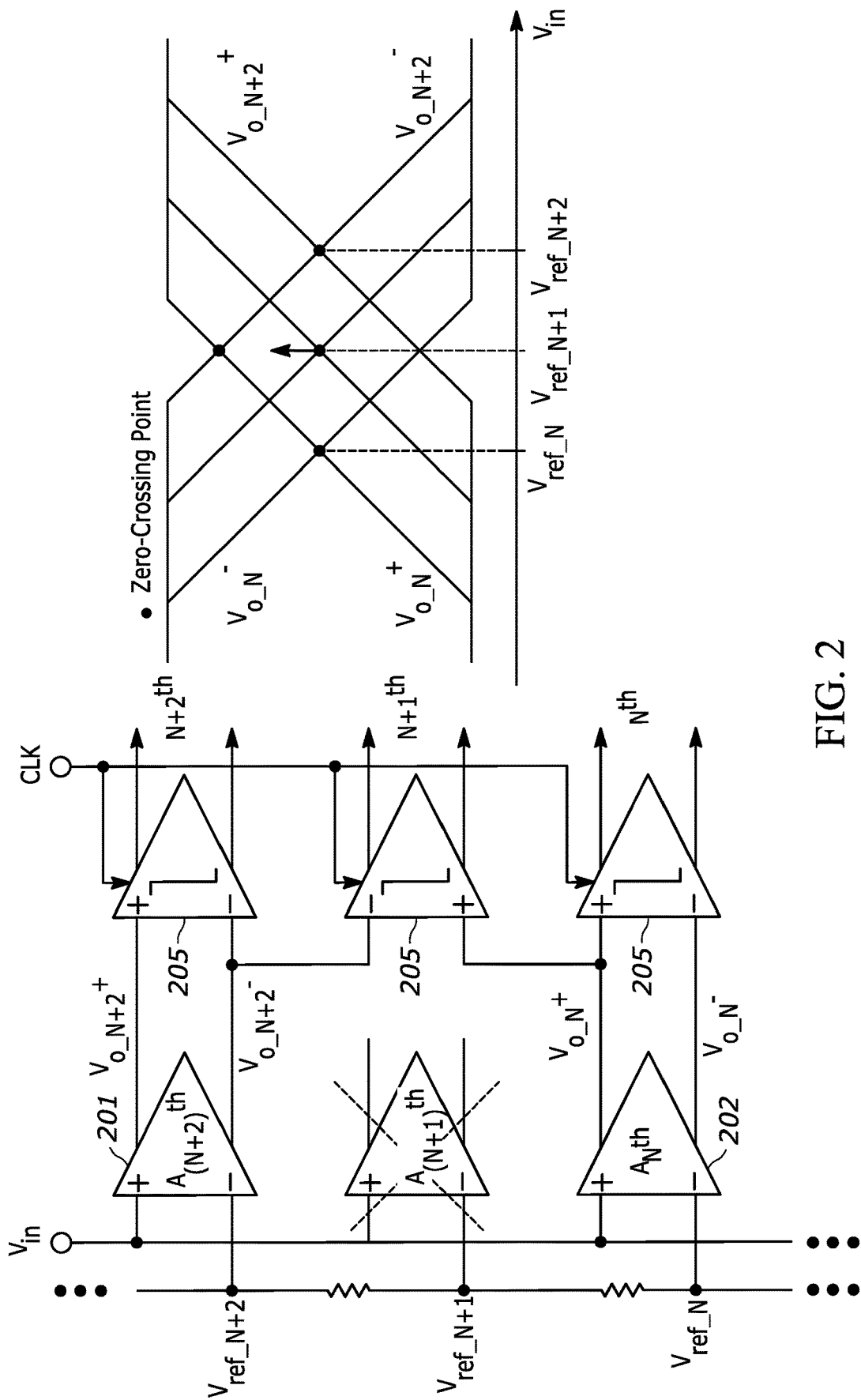
FIG. 2 discloses an architecture of time-domain interpolating scheme and its transfer curve.

FIG. 2 discloses an architecture of time-domain interpolating scheme and its transfer curve. In one embodiment, the preamplification stage of comparators 205 (e.g., one or more comparator 205) also can be used for an interpolating scheme of a flash ADC as well. The N+1$^{th}$ stage's preamplifier can be eliminated and the N+1$^{th}$ comparator takes one of the two outputs of each of the adjacent stages' preamplifiers 201, 203 (e.g. $V_{o\_N}^+$ and $V_{o\_N+2}^-$) and this way it can generate a zero-crossing point at N+1$^{th}$ the stage in between the N$^{th}$ and the N+2$^{nd}$ stage by means of interpolating between these two points.

Figure 3:
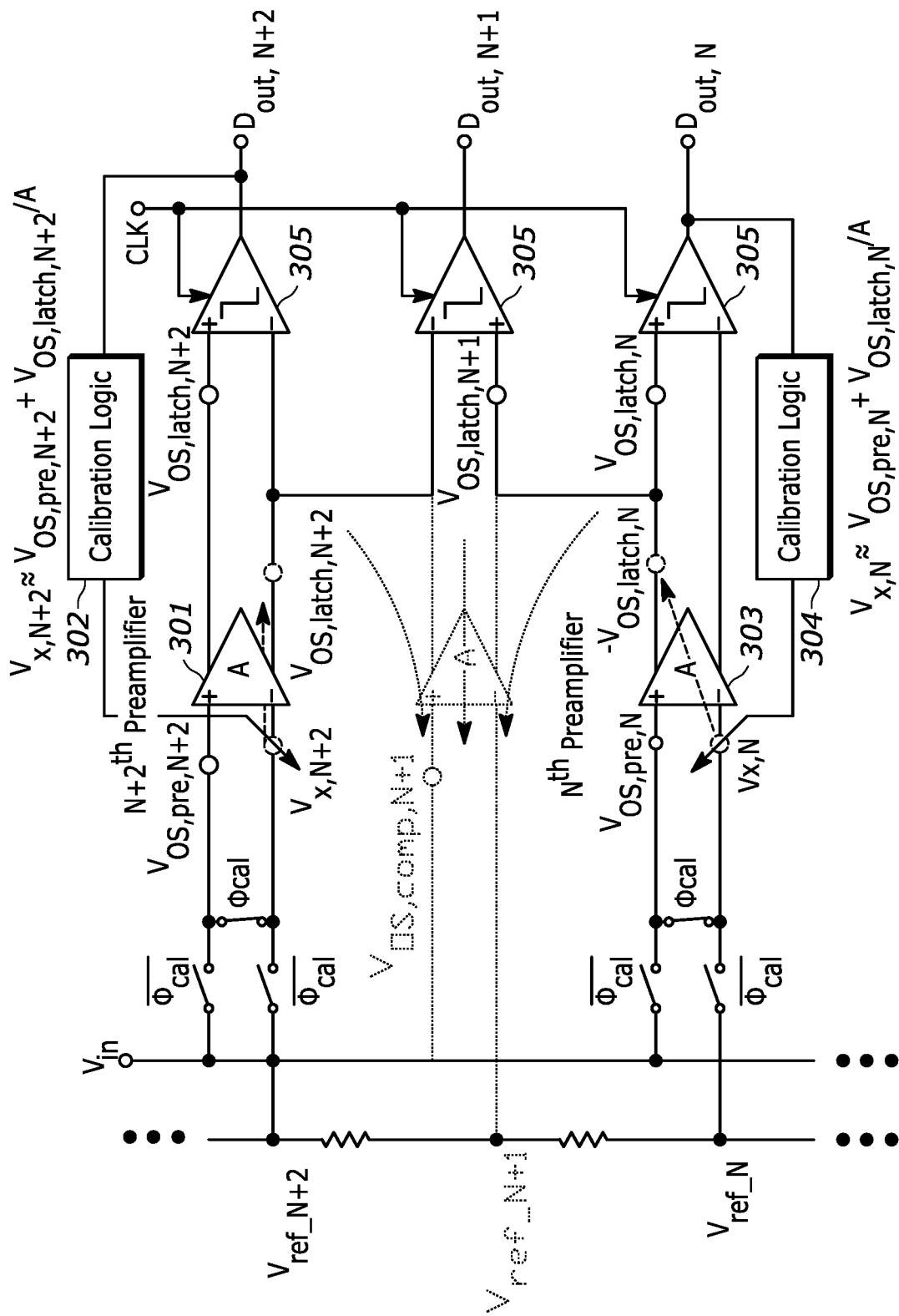
FIG. 3 discloses an embodiment of an offset behavior of comparators in an interpolating scheme.

FIG. 3 discloses an embodiment of an offset behavior of comparators 305 in an interpolating scheme. As explained in FIG. 1 above, the self-calibration may correct the offset, both of $V_{OS,pre}$ and $V_{OS,latch}$. This may that because $V_{OS,latch}$ is also calibrated via calibration logic (e.g., calibration logic 302, 304), the gain of preamplifier 301 doesn't need to be that high. However, when the same calibration scheme is implemented in the interpolating flash ADC, there should have another consideration for the offset of the latch in the interpolating stage (N+1$^{th}$). As FIG. 3 shows, the offset of non-interpolating stages (N$^{th}$, N+2$^{th}$) are eliminated by the calibration scheme together with their corresponding preamplifiers (e.g., preamplifier 301) while the offset of regenerative latch in interpolating stage (N+1$^{th}$) still remains. In this situation, because the calibrating voltage ($V_{X,N}$, $V_{X,N+2}$) contains the input referred offset of followed regenerative latch, the outputs of the calibrated preamplifier 303 contains the opposite polarity of offsets of the regenerative latch ($-V_{OS,latch,N}$, $V_{OS,latch,N+2}$). These not only cancel the offset of corresponding regenerative latch, but also are added to the input of regenerative latch in interpolating stage (N+1$^{th}$). Because the offset of each stage's regenerative latch is uncorrelated, an input referred offset of the interpolating stage (N+1$^{th}$) can be expressed to:

$$V_{OS,comp,N+1} = \frac{\sqrt{V_{OS,latch,N}^2 + V_{OS,latch,N+1}^2 + V_{OS,latch,N+2}^2}}{A}. \quad (2)$$

Considering the standard deviations of these offsets are the same because of the same circuits for regenerative latches, the input referred offset on the above can be written again as:

$$V_{OS,comp,N+1} = \frac{\sqrt{3} \, V_{OS,latch}}{A} \quad (3)$$

where $V_{OS,latch}$ is the input referred offset of the regenerative latch used in whole stages. This shows that the offset of interpolating stage (N+1$^{th}$) increases even if offsets of non-interpolating stage (N$^{th}$, N+2$^{th}$) are eliminated by the calibration. This means that the preamplifier of the interpolating flash ADC should have much larger gain values (>×10) to overcome this issue compared to a non-interpolating flash ADC.

Realizing high speed and higher gain pre-amplifiers has major challenges. For instance, conventional structures shown in FIGS. 4a and b cannot implement large gain because the gain is determined by $g_{m,in}/g_{m,load}$ where $g_{m,in}$ and $g_{m,load}$ are the transconductance of input transistor and load transistor, respectively. A structure on FIG. 4c with high DC gain of $g_m \cdot R_{out}$ is also used with incomplete settling where $g_m$ is the transconductance of input transistor and $R_{out}$ is an output impedance. However, increasing $R_{out}$ always entails the increase of transistor length but this increases the parasitic capacitance at the output nodes significantly, resulting in reduced bandwidth.

Figure 5:
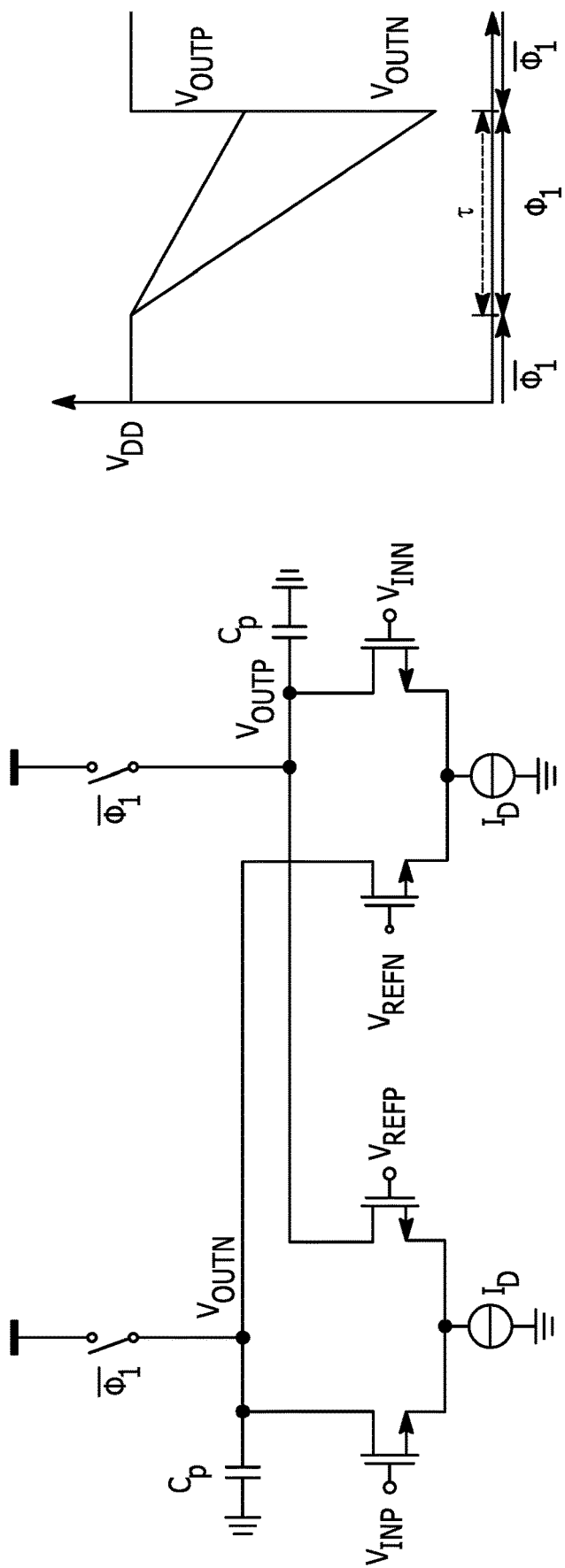
FIG. 5 discloses a schematic of a dynamic preamplifier and its timing diagram.

FIG. 5 shows the schematic of a dynamic preamplifier for the comparator. Before starting amplification, the outputs ($V_{OUTP}$, $V_{OUTN}$) are reset to $V_{DD}$ during ~$\phi_1$. After reset phase, the input transistors draw a differential current from load capacitors $C_p$ proportional to the differential input signal ($V_{INP}$, $V_{INN}$). This corresponds to a net amount of charge taken out of $C_p$ capacitors during the amplification phase $\phi 1$, resulting in an output differential voltage ($V_{OUTP}$, $V_{OUTN}$). The amplification factor or amplifier gain ($A_v$) is thus determined by:

$$A_v = \tau g_m / C_p \quad (4)$$

where $\tau$ is the amplification time (duration of phase $\phi 1$), $g_m$ is the transconductance of the input transistor, and $C_p$ is the parasitic capacitance at the output node.

Figure 4A:
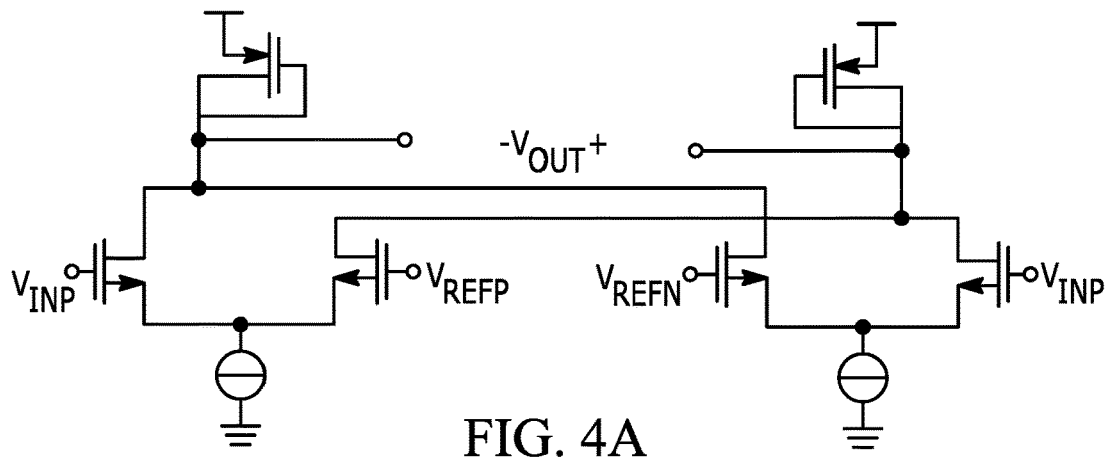
FIG. 4A disclose a first embodiment of a conventional structure of a preamplifier.
Figure 4B:
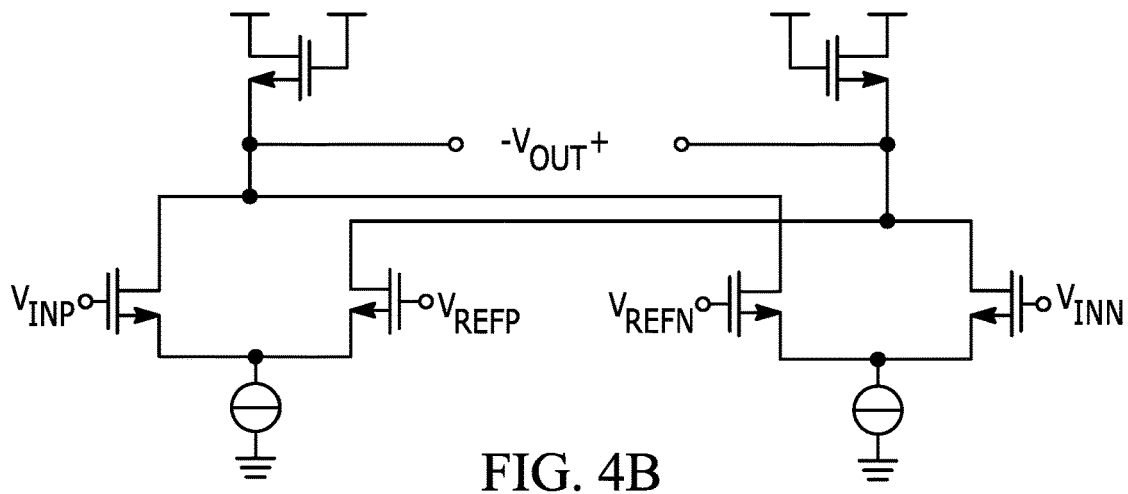
FIG. 4B disclose a second embodiment of a conventional structure of a preamplifier.
Figure 4C:
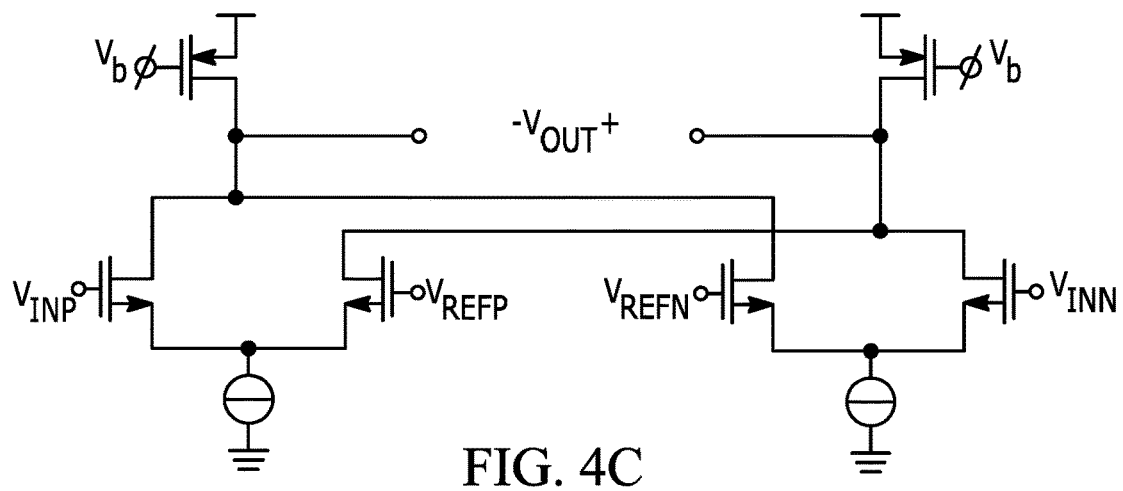
FIG. 4C disclose a third embodiment of a conventional structure of a preamplifier with a higher DC gain.

Table I shows the gain comparison between the dynamic amplifier (FIG. 5) and the conventional preamplifier structures (FIG. 4a-b). Here a few assumptions are made: The $g_m$ and the parasitic load capacitance $C_p$ of the amplifiers are equal, and for an $f_B$ being the −3 dB bandwidth of the conventional preamplifier, $\tau$, is half of $1/f_B$ in order to allow sufficient reset time for the dynamic amplifier. With these assumptions, the dynamic preamplifier achieves ~×3 larger gain than the conventional preamplifier. Considering larger $C_p$ for conventional amplifiers, the dynamic amplifier's gain benefit is even larger.

TABLE 1

A gain comparison between the proposed dynamic preamplifier and conventional preamplifier

| Dynamic preamplifier Gain ($A_v$) in FIG. 5 | Conventional preamplifier Gain ($A_v$) in FIG. 4a-b |
|---|---|
| $A_v = \tau g_m/C_p = g_m/2f_B C_p$ | $A_v = g_m/2\pi f_B C_p$ |

However, dynamic amplifiers also have limitations, e.g. in order to achieve larger gain levels for a given amplification time, ti, their $g_m$ should be increased according to the equation (4). Increasing $g_m$ entails the increase of static current, $I_D$, resulting in a saturation of $V_{OUT}$ for a given value of $C_p$ due to the effect of the common-mode current discharging the load capacitors at a rapid pace. Therefore, a practical achievable gain of dynamic amplifier is limited normally less than ×10.

Figure 6A:
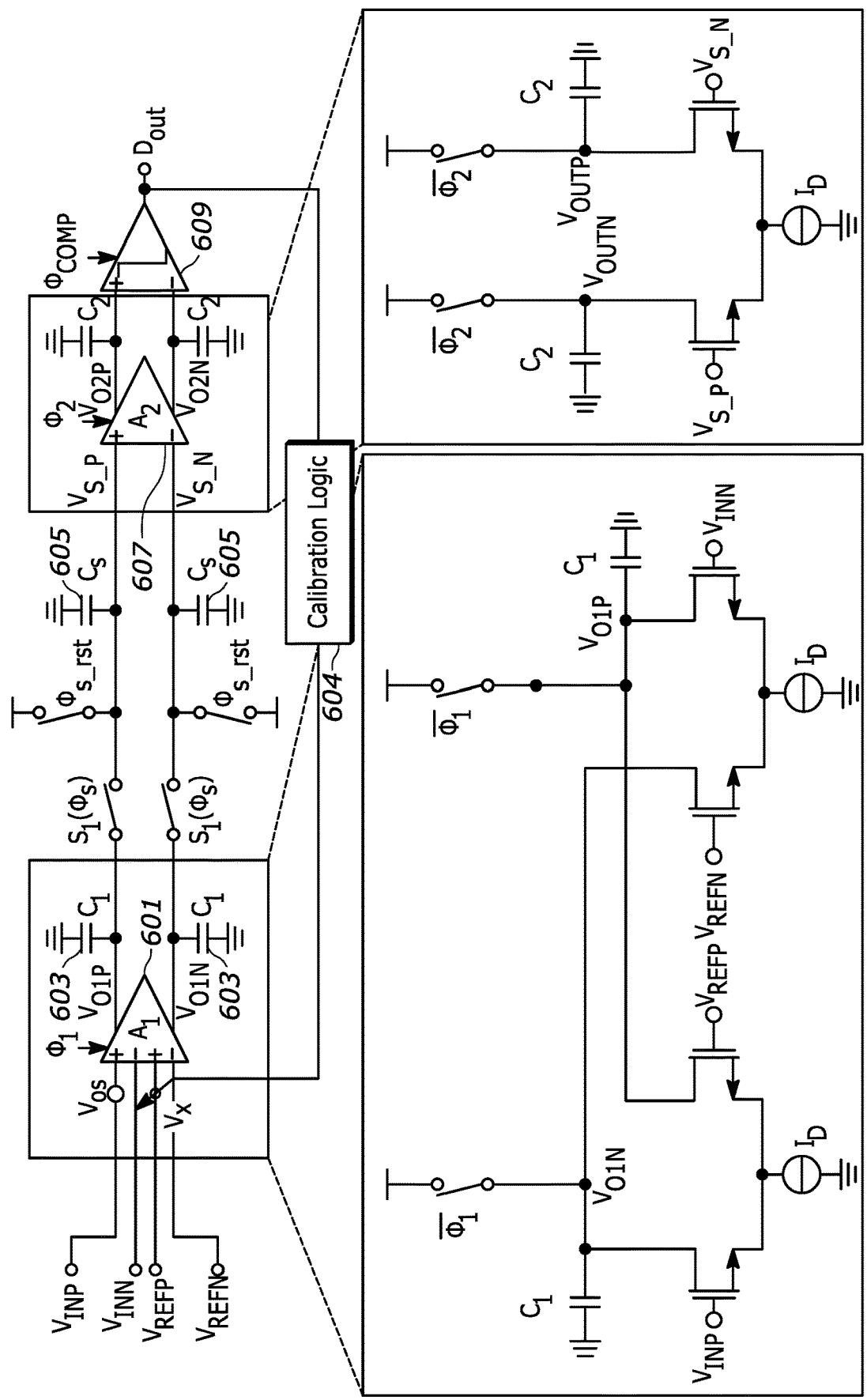
FIG. 6A discloses a schematic of a pipelined dynamic preamplifier.
Figure 6B:
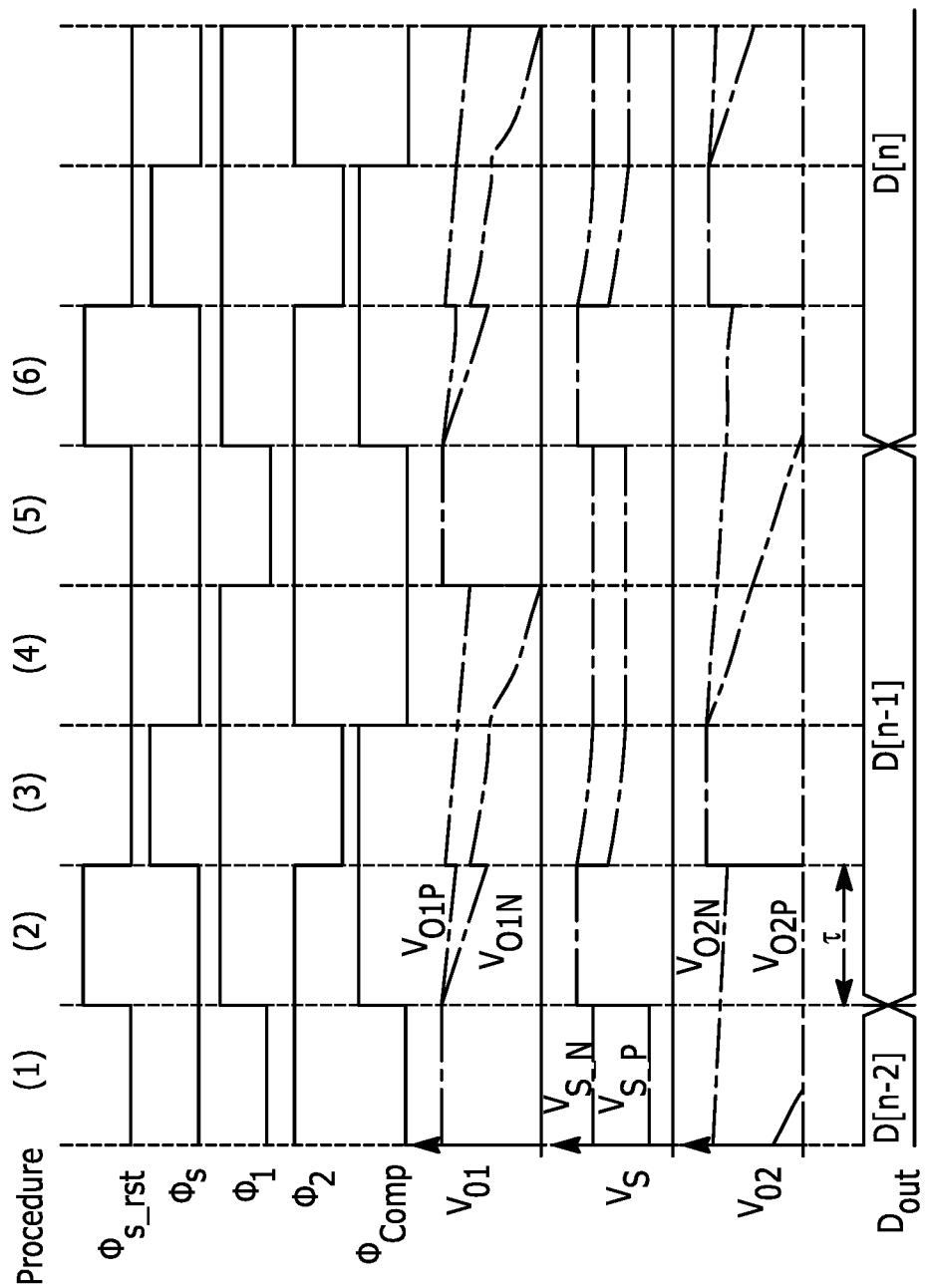
FIG. 6B discloses a corresponding timing diagram of the pipelined dynamic preamplifier from FIG. 6A.

FIG. 6A discloses a schematic of a pipelined dynamic preamplifier. FIG. 6B discloses a corresponding timing diagram of the pipelined dynamic preamplifier from FIG. 6A. To resolve the challenge of gain increase, the embodiments illustrated propose a pipelined dynamic preamplifier. The proposed preamplifier schematic, operation and its timing diagram are shown in FIG. 6. The pipelined dynamic amplifier consists of two cascading dynamic preamplifiers 601, 605 ($A_1$, $A_2$), sampling switches ($S_1$), a regenerative latch, a comparator 609, and calibration logic 604. A procedure of operating principle is describes as below:

Phase (1): The output nodes of the $1^{st}$ dynamic amplifiers ($V_{O1P}$, $V_{O1N}$) are reset to $V_{DD}$.

Phase (2): The first preamplifier's output nodes start discharging the loading capacitors 603, $C_1$, based on the input voltage as explained in the previous sections. During the same phase, the input capacitors of the $2^{nd}$ dynamic amplifier ($C_S$) are reset to $V_{DD}$.

Phase (3): The sampling switches ($S_1$) are turned on, and then connect the outputs of 1st preamplifier ($A_1$) and the inputs of $2^{nd}$ preamplifier ($A_2$). Therefore, the charge on $C_1$ and $C_s$ are shared in an instant and the first amplifier continues amplification from the level at the end of phase (2) but at a reduced gain due to the increased load capacitance ($C_1 \rightarrow C_1 + C_s$). In the meantime, the outputs of the $2^{nd}$ amplifier are reset to $V_{DD}$ in order to prepare this amplifier for the second phase amplification (pipeline operation).

Phase (4)~(5): $S_1$ is disconnected and the charge on $C_s$ is held at the input of the second amplifier until it is reset. This corresponds to a sample and hold function of the signal. The sampled signal is then amplified by $A_2$ during these phases. In the meanwhile, the first amplifier is reset during phase (5) to prepare it for the next sample.

Phase (6): Finally, at the beginning of this phase, the amplified signal is quantized to a digital signal by the regenerative latch.

Throughout this procedure, the gain of the pipelined preamplifier is the multiplied value of these two gain of preamplifiers, thus can obtain high gain ($A_v$) of:

$$A_v = A_{v1} \times A_{v2} = \frac{2\tau g_{m1}}{(C_1 + C_s)} \times \frac{2\tau g_{m2}}{C_2} \tag{5}$$

where $\tau$ is the time step of each phase, $A_{v1}$ and $A_{v2}$ are the gain of $A_1$ and $A_2$, and $g_{m1}$ and $g_{m2}$ represents the input transconductance of $A_1$ and $A_2$, respectively. In addition to this, thanks to the two step amplification, the input driver and the reference driver rarely suffer from the kickback effect of the latch even with high gain preamplifier.

Figure 7:
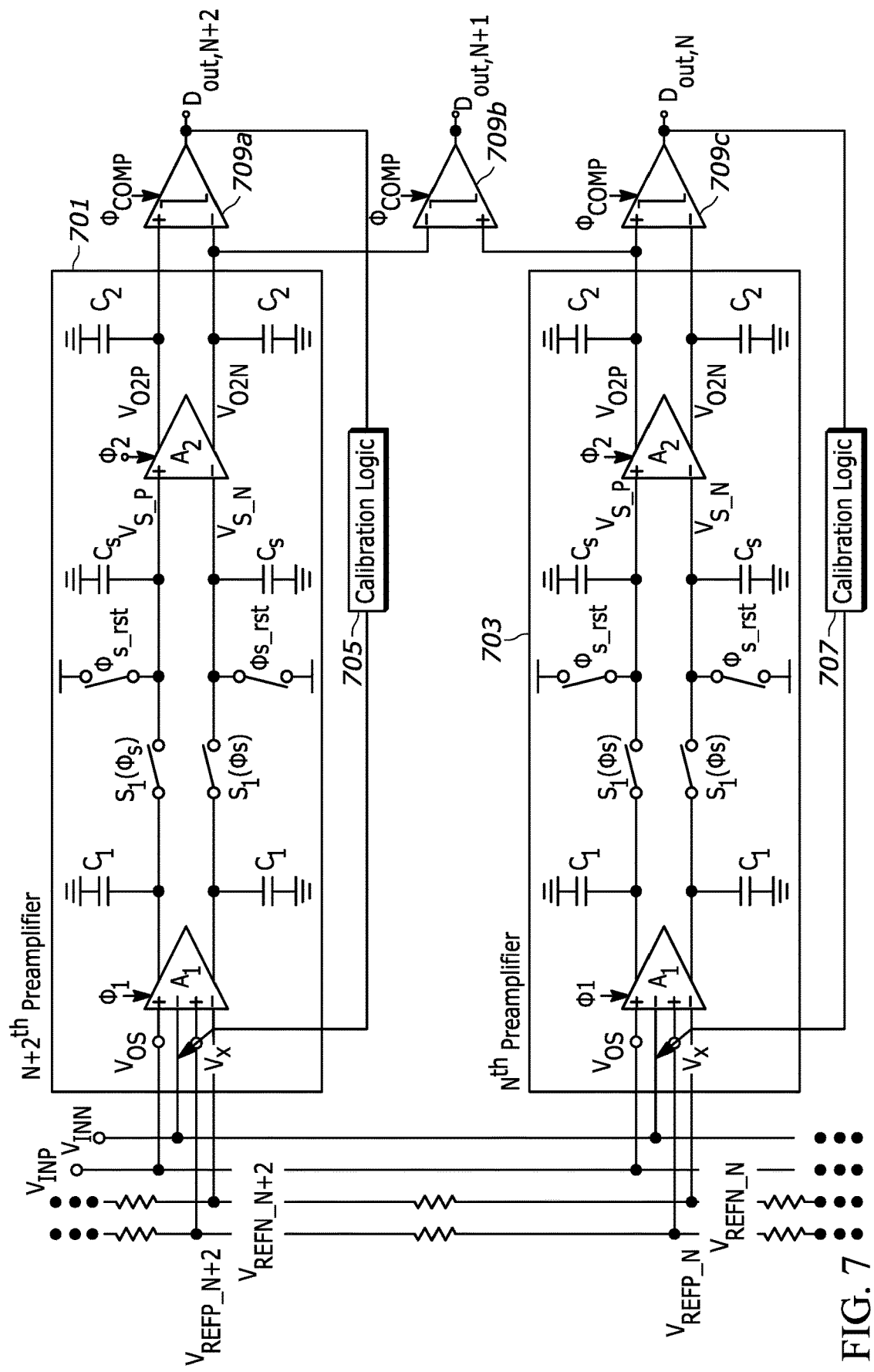
FIG. 7 discloses a schematic of a pipelined dynamic preamplifier into an interpolating scheme.

FIG. 7 discloses a schematic of a pipelined dynamic preamplifier into an interpolating scheme. Such an example implementation of pipelined dynamic amplifier may be utilized into the interpolating scheme which was described in FIG. 3. As such, the preamplifiers shown on FIG. 3 may be replaced to a 2 stage differential pipelined dynamic preamplifier 701, 703 which consists of two stage dynamic amplifiers ($A_1$, $A_2$), integration capacitors ($C_1$, $C_S$, $C_2$), and the sampling switches ($S_1$) as the same with that described on FIG. 6. The rest of the blocks of the diagram maybe the same with FIG. 3. For example, comparators 709a, 709b, and 709c may be utilized in the interpolating scheme. Additionally, calibration logic 705, 707 may be utilized.

As can be observed from the operation of the pipelined preamplifier architecture, more amplification can be achieved while maintaining the sample rate of the ADC, but at the cost of one clock delay due to the pipeline operation. In many applications such as the automotive Lidar, this delay may be irrelevant to the performance and operation of the overall system.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A system including a circuit in an amplifier, comprising:
   a first preamplifier;
   a sampling switch;
   a regenerative latch; and
   a second preamplifier aligned in a pipelined sequence with the first preamplifier, wherein the first and second preamplifier are associated with a dynamic comparator and configured to amplify a signal utilizing multiple cascaded gains and sample-and-hold stages including a plurality of phases.

2. The system of claim 1, wherein the circuit includes output nodes associated with the first preamplifier, wherein the output nodes are reset to a voltage drain during a first phase.

3. The system of claim 1, wherein the first preamplifier is configured to start discharging a load associated with a first capacitor in response to an input voltage in a second phase.

4. The system of claim 1, wherein the sampling switch is turned on and connects one or more outputs of the first preamplifier with one or more inputs of the second preamplifier during a third phase.

5. The system of claim 1, wherein the amplified signal is quantized to a digital signal utilizing the regenerative latch during a sixth phase.

6. The system of claim 1, wherein the system includes an amplifier gain $A_v$, wherein $A_v = \tau g_m / C_p$.

7. The system of claim 1, wherein the one or more sampling switches are turned on and cause an output node associated with the first preamplifier to connect with an input node of the second preamplifier, wherein a loading capacitor at the output node of the first preamplifier and a loading capacitor at the input node of the second preamplifier during a second phase.

8. A pipelined dynamic preamplifier system, comprising:
   a first dynamic preamplifier;
   a second dynamic preamplifier, wherein the first and second dynamic preamplifier are arranged in a pipelined sequence;
   one or more sampling switches; and
   a regenerative latch, wherein the regenerative latch is configured to amplify signal utilizing multiple cascaded gains and sample-and-hold stages including a plurality of phases.

9. The pipelined dynamic preamplifier of claim 8, wherein the system includes output nodes associated with the first dynamic preamplifier, wherein the output nodes are reset to a voltage drain during a first phase.

10. The pipelined dynamic preamplifier of claim 8, wherein the one or more sampling switches are turned on and cause an output node associated with the first dynamic preamplifier to connect with an input node of the second dynamic preamplifier, wherein a loading capacitor is located at the output node of the first dynamic preamplifier and a loading capacitor is located at the input node of the second dynamic preamplifier during a second phase.

11. The pipelined dynamic preamplifier of claim 10, wherein an output node associated with the second dynamic preamplifier is reset to a voltage drain prior to a second phase.

12. The pipelined dynamic preamplifier of claim 10, wherein the one or more sampling switches are configured to turn on and connect the output node associated with the first dynamic preamplifier and the input node of the second dynamic preamplifier, wherein a charge of the load capacitor at the output node of the first dynamic preamplifier and the loading capacitor of the input node of the second dynamic preamplifier are shared at an instant, and the first dynamic preamplifier continues amplification from a level at an end of the second phase but at an increased gain.

13. The pipelined dynamic preamplifier of claim 12, wherein one or more sampling switches are disconnected and the charge on the loading capacitor of the input node of the second dynamic preamplifier is held at the input node of the second dynamic preamplifier until it is reset, wherein a sampled signal is amplified during a fourth phase or a fifth phase.

14. The pipelined dynamic preamplifier of claim 13, wherein the first dynamic preamplifier is reset during a fifth phase and configured to prepare for a corresponding sample signal.

15. The pipelined dynamic preamplifier of claim 14, wherein the amplified signal is quantized to a digital signal via the regenerative latch during a sixth phase, and the second dynamic preamplifier continues to amplify.

16. The pipelined dynamic preamplifier of claim 15, wherein a high gain $A_v$ can be achieved as $$A_v = A_{v1} \times A_{v2} = \frac{2\tau g_{m1}}{(C_1 + C_s)} \times \frac{2\tau g_{m2}}{C_2},$$

wherein $\tau$ is a time step associated with each phase, $A_{v1}$ and $A_{v2}$ are the gain of the first dynamic preamplifier and the second dynamic preamplifier, and $g_{m1}$ and $g_{m2}$ represents an input transconductance of the first dynamic preamplifier and the second dynamic preamplifier, respectively.

17. The pipelined dynamic preamplifier of claim 8, wherein the first and second dynamic preamplifier are each 2-stage differential pipelined dynamic preamplifiers.

18. A method for outputting a digital signal via a pipelined dynamic preamplifier system, comprising:
   arranging in a cascading arrangement a first dynamic preamplifier and a second dynamic preamplifier; and
   quantizing the digital signal during a final phase of a sample-and-hold sequence, wherein the quantizing utilizes a regenerative latch.

19. The method of claim 18, wherein one or more sampling switches are disconnected and a charge on one or more capacitors are held at an input of the second dynamic preamplifier until it is reset, wherein a sampled signal is amplified during a fourth phase or a fifth phase.

20. The method of claim 18, wherein the method includes increasing the dynamic preamplifier system gain by utilizing an additional gain and an additional sample-and-hold stage via at least a third dynamic preamplifier.

* * * * *